United States Patent
Lim et al.

(10) Patent No.: US 9,245,975 B2
(45) Date of Patent: Jan. 26, 2016

(54) RECESSED CHANNEL INSULATED-GATE FIELD EFFECT TRANSISTOR WITH SELF-ALIGNED GATE AND INCREASED CHANNEL LENGTH

(71) Applicant: Texas Instruments Incorporated, Dallas, TX (US)

(72) Inventors: Kwan-Yong Lim, Plano, TX (US); Stanley Seungchul Song, San Diego, CA (US); Amitabh Jain, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/487,663

(22) Filed: Sep. 16, 2014

(65) Prior Publication Data
US 2015/0037952 A1      Feb. 5, 2015

Related U.S. Application Data

(62) Division of application No. 13/707,865, filed on Dec. 7, 2012, now Pat. No. 8,865,549.

(51) Int. Cl.
*H01L 21/336* (2006.01)
*H01L 29/66* (2006.01)
(Continued)

(52) U.S. Cl.
CPC ........ *H01L 29/66666* (2013.01); *H01L 29/045* (2013.01); *H01L 29/4236* (2013.01); *H01L 29/42364* (2013.01); *H01L 29/66545* (2013.01);
(Continued)

(58) Field of Classification Search
CPC .................. H01L 29/66666; H01L 29/66545; H01L 29/66621; H01L 29/66659; H01L 29/7834; H01L 29/7827
USPC ............................................. 438/270; 257/330
See application file for complete search history.

(56) References Cited

U.S. PATENT DOCUMENTS

| 7,804,130 B1 | 9/2010 | Fung |
| 2009/0011561 A1* | 1/2009 | Chen ............................ 438/275 |

(Continued)

OTHER PUBLICATIONS

Kim, "Technology for sub-50nm DRAM and NAND Flash Manufacturing", Technical Digest, 2005 IEEE International Electron Device Meeting (IEEE, 2005), pp. 323-326.
(Continued)

*Primary Examiner* — Reema Patel
*Assistant Examiner* — Syed Gheyas
(74) *Attorney, Agent, or Firm* — Jacqueline J. Garner; Frank D. Cimino

(57) ABSTRACT

A metal-oxide-semiconductor transistor (MOS) and method of fabricating the same, in which the effective channel length is increased relative to the width of the gate electrode. A dummy gate electrode overlying dummy gate dielectric material is formed at the surface of the structure, with self-aligned source/drain regions, and dielectric spacers on the sidewalls of the dummy gate structure. The dummy gate dielectric underlies the sidewall spacers. Following removal of the dummy gate electrode and the underlying dummy gate dielectric material, including from under the spacers, a silicon etch is performed to form a recess in the underlying substrate. This etch is self-limiting on the undercut sides, due to the crystal orientation, relative to the etch of the bottom of the recess. The gate dielectric and gate electrode material are then deposited into the remaining void, for example to form a high-k metal gate MOS transistor.

13 Claims, 13 Drawing Sheets

(51) Int. Cl.
 *H01L 29/78* (2006.01)
 *H01L 29/423* (2006.01)
 *H01L 29/04* (2006.01)

(52) U.S. Cl.
 CPC ...... *H01L 29/66621* (2013.01); *H01L 29/7827* (2013.01); *H01L 29/7834* (2013.01)

(56) References Cited

U.S. PATENT DOCUMENTS

| | | | |
|---|---|---|---|
| 2013/0026558 A1 | 1/2013 | Jeon et al. | |
| 2013/0069148 A1 | 3/2013 | Izumida et al. | |
| 2013/0071977 A1* | 3/2013 | Scheiper et al. | 438/299 |
| 2013/0248985 A1* | 9/2013 | Amarnath et al. | 257/330 |

OTHER PUBLICATIONS

Yang, et al. "Performance Dependence of CMOS on Silicon Substrate Orientation for Ultrathin Oxynitride and HfO2 Gate Dielectrics", Elec. Dev. Letters, vol. 24, No. 5 (IEEE, May 2003), pp. 339-342.

Kim et al., "The Breakthrough in data retention time of DRAM using Recess-Channel-Array Transistor (RCAT) for 88nm feature size and beyond", Digest of Technical Papers, 2003 Symposium on VLSI Technology, paper 2-2 (IEEE, 2003), pp. 11, 12.

Kim et al., "S-RCAT (Sphere-shaped-Recess-Channel-Array Transistor) Technology for 70nnn DRAM feature size and beyond", Digest of Technical Papers, 2005 Symposium on VLSI Technology, paper 3B-2 (IEEE, 2005), pp. 34, 35.

\* cited by examiner

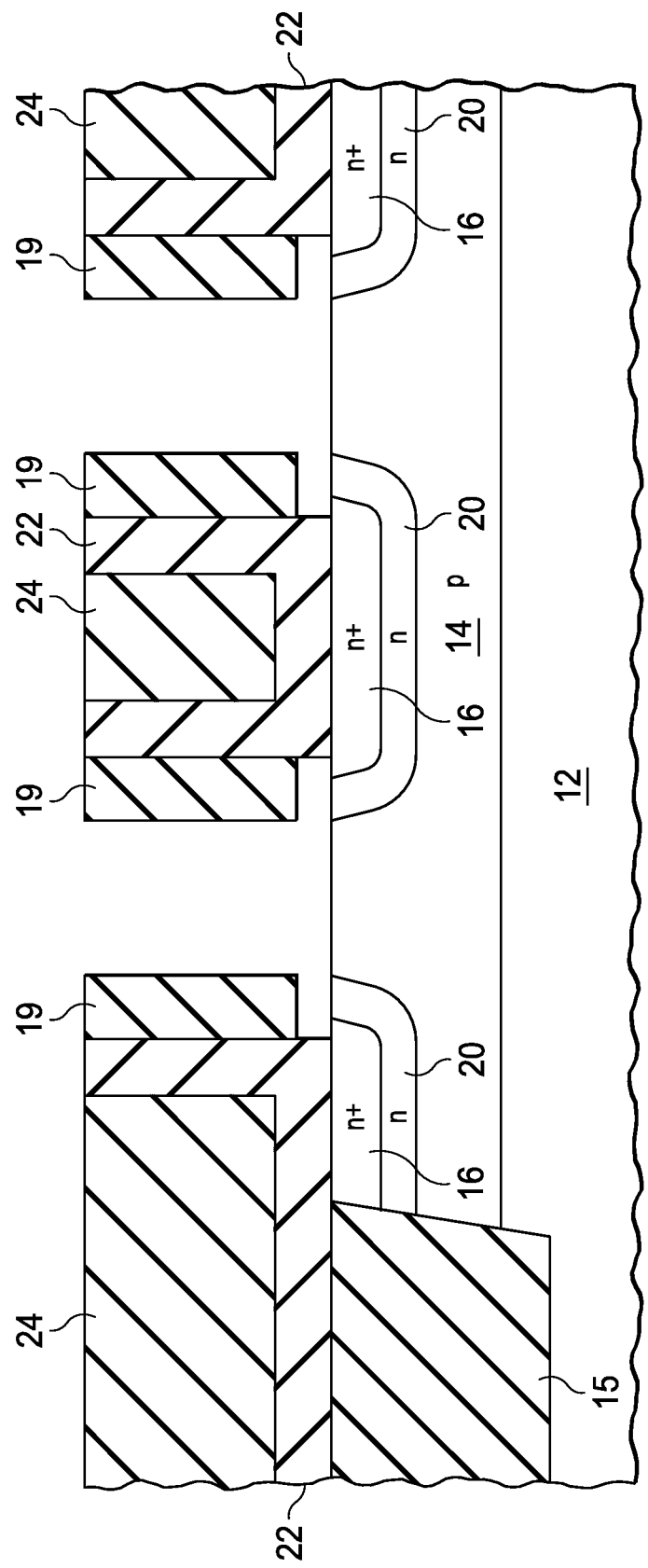

RECESSED CHANNEL INSULATED-GATE FIELD EFFECT TRANSISTOR WITH SELF-ALIGNED GATE AND INCREASED CHANNEL LENGTH

CROSS-REFERENCE TO RELATED APPLICATIONS

This application is a divisional of U.S. Nonprovisional patent application Ser. No. 13/707,865, filed Dec. 7, 2012, the contents of which are herein incorporated by reference in its entirety.

BACKGROUND OF THE INVENTION

This invention is in the field of integrated circuits and their manufacture. Embodiments of this invention are more particularly directed to metal-oxide-semiconductor field-effect transistors (MOSFETs) with extremely narrow gate electrodes.

Many modern electronic devices and systems now include substantial computational capability for controlling and managing a wide range of functions and useful applications. As is fundamental in the art, reduction in the size of physical feature sizes of structures realizing transistors and other solid-state devices enables greater integration of more circuit functions per unit "chip" area, or conversely, reduced consumption of chip area for a given circuit function. The capability of integrated circuits for a given cost has greatly increased as a result of this miniaturization trend.

Advances in semiconductor technology in recent years have enabled the shrinking of the minimum device feature size (e.g., the width of the gate electrode of a metal-oxide-semiconductor (MOS) transistor, which defines the transistor channel length) into the extreme sub-micron range. State of the art transistor channel lengths are now approaching the sub-20 nanometer regime, which is on the same order of magnitude as the source and drain depletion widths. At these extremely small channel lengths, however, certain undesired effects in the electrical characteristics of MOS transistors have been observed. These undesired effects are referred to in the art as "short-channel effects", or "SCE".

One of these short-channel effects is referred to in the art as "ballistic transport behavior", or surface scattering, that reduces carrier mobility to a sufficient extent to be observable in the electrical characteristics of the transistor. It has been observed that gate widths (i.e., effective channel lengths) on the order of 20 nm or less are vulnerable to this short channel effect.

Another short channel effect is referred to as drain-induced barrier lowering, which refers to the reduction of the potential barrier to carriers in the channel region in transistors with extremely short channel lengths. This barrier lowering allows electrons to travel from source to drain under $V_{ds}$ bias, even with the gate-to-source voltage below the threshold voltage. This subthreshold leakage is generally undesirable in digital circuits, particularly in applications that are sensitive to power consumption, such as mobile devices, implantable medical devices, and other battery-powered systems.

Another undesired subthreshold effect is referred to as the inverse narrow width effect ("INWE"), in which the threshold voltage becomes lower with narrower channel width. It has been observed that this effect is concentrated at the edges of the transistor channel, specifically at the active-to-field edge underlying the gate electrode. Leakage due to INWE typically exhibits a relatively large variance over a population of transistors, particularly in devices in which the channel edges are not well-controlled. This large variance is especially problematic in those analog circuits that rely on good matching of device characteristics.

Other short-channel effects include velocity saturation, which reduces transconductance; impact ionization, which can cause source-to-substrate leakage; and the generation and trapping of "hot" electrons, which degrades transistor performance by increasing its threshold voltage over time.

By way of further background, the scaling of MOS transistor feature sizes into the deep submicron realm has necessitated the thinning of the MOS gate dielectric layer, if conventional gate dielectric layers (e.g., silicon dioxide) are used, to an extent that can be problematic from the standpoint of gate current leakage, manufacturing yield and reliability. In response to this limitation of conventional gate dielectric material, so-called "high-k" gate dielectrics, such as hafnium oxide ($HfO_2$), have become popular. These dielectrics have higher dielectric constants than silicon dioxide and silicon nitride, permitting those films to be physically thicker than corresponding silicon dioxide films while remaining suitable for use in high performance MOS transistors. Gate electrodes of metals and metal compounds, such as titanium nitride, tantalum-silicon-nitride, tantalum carbide, and the like are now also popular in modern MOS technology, especially in combination with these high-k gate dielectrics. These metal gate electrodes eliminate the undesired polysilicon depletion effect, which is particularly noticeable at the extremely small feature sizes required of these technologies.

By way of further background, U.S. Pat. No. 7,804,130 describes a conventional recessed-channel MOS transistor that is intended to increase the effective channel length of the transistor from that defined by the gate width. According to this approach, a "dummy" polysilicon gate electrode is formed over a dummy gate oxide structure, with spacers on the sidewall of the dummy gate electrode; source and drain implants are performed in a self-aligned manner relative to that dummy gate electrode. Following deposition of a dielectric layer overall, the dummy gate electrode and gate oxide are removed, followed by an etch of a recess into the silicon channel region between the spacers. This etch of the channel region is disclosed as preferential in the <100> silicon crystal planes, while being self-limiting in the <111> plane, which in this process results in a V-shaped recessed conduction channel along the <111> plane surfaces. Deposition of a gate dielectric over the recess, followed by deposition of the eventual gate electrode into the opening between the spacers, completes the transistor.

By way of further background, Kim, "Technology for sub-50 nm DRAM and NAND Flash Manufacturing", *Technical Digest*, 2005 *IEEE International Electron Device Meeting* (IEEE, 2005), pp. 323-26, describes a dynamic random access memory (DRAM) array in which the cell transistors are formed as recessed channel devices.

BRIEF SUMMARY OF THE INVENTION

Embodiments of this invention provide a transistor structure and method of fabricating the same that provides an increased channel length relative to the width of the gate electrode.

Embodiments of this invention provide such a structure and method in which short channel effects are significantly reduced.

Embodiments of this invention provide such a structure and method that can readily implement high-k metal gate technology.

Other objects and advantages of embodiments of this invention will be apparent to those of ordinary skill in the art having reference to the following specification together with its drawings.

Embodiments of this invention may be implemented in a replacement gate transistor and method, in which dielectric spacers on the sidewalls of a dummy gate electrode are formed to overlie a dummy gate dielectric film formed over a single-crystal silicon surface. The dummy gate electrode is removed by way of a polysilicon etch, followed by a selective etch of the dummy gate dielectric film, including from under the dielectric spacers. A silicon etch of a recess into the silicon surface undercuts the dielectric spacers along a preferential plane from the standpoint of carrier mobility in the eventual transistor. A gate dielectric layer is then formed over the resulting recessed channel region, followed by formation of a gate electrode over the gate dielectric to define the transistor.

In some embodiments of the invention, the source and drain regions are formed in a self-aligned manner relative to the dummy gate electrode, such that the heavier-doped source/drain implanted regions are shallower than the more lightly-doped drain extension regions.

BRIEF DESCRIPTION OF THE SEVERAL VIEWS OF THE DRAWING

FIGS. 2a through 2k are cross-section views of the portion of the integrated circuit of FIG. 1a, illustrating steps in a method of forming transistors according to an embodiment of the invention.

DETAILED DESCRIPTION OF THE INVENTION

This invention will be described in connection with its embodiments, namely as implemented into an integrated circuit using a high-k gate dielectric and a gate material of a compatible metal, as it is contemplated that this invention will be especially beneficial when used in such an application. However, it is contemplated that embodiments of this invention will be beneficial when used in connection with other technologies and in other applications. Accordingly, it is to be understood that the following description is provided by way of example only, and is not intended to limit the true scope of this invention as claimed.

Figure 1A:
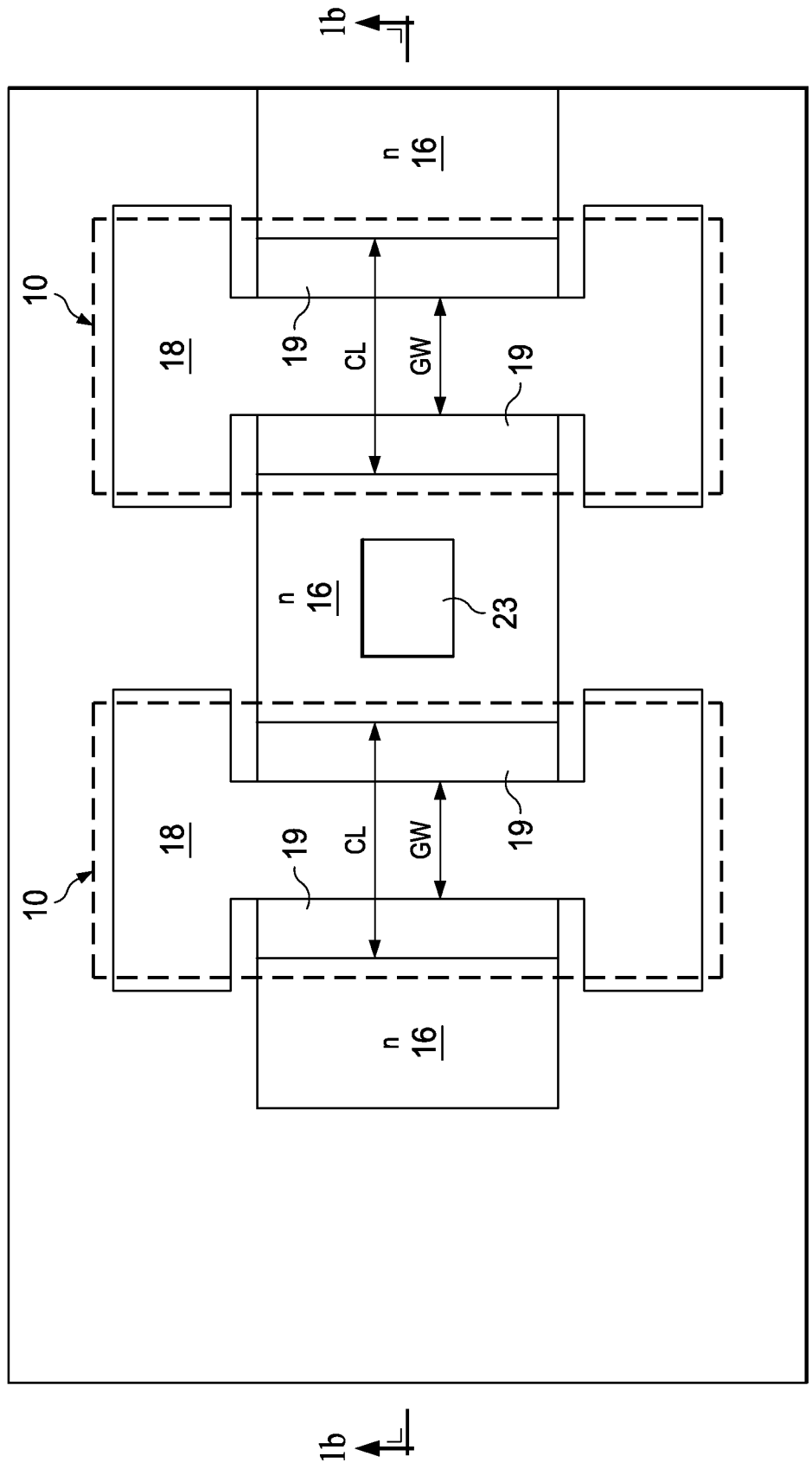
FIG. 1a is a plan view of a portion of an integrated circuit including transistors constructed according to an embodiment of the invention.
Figure 1B:
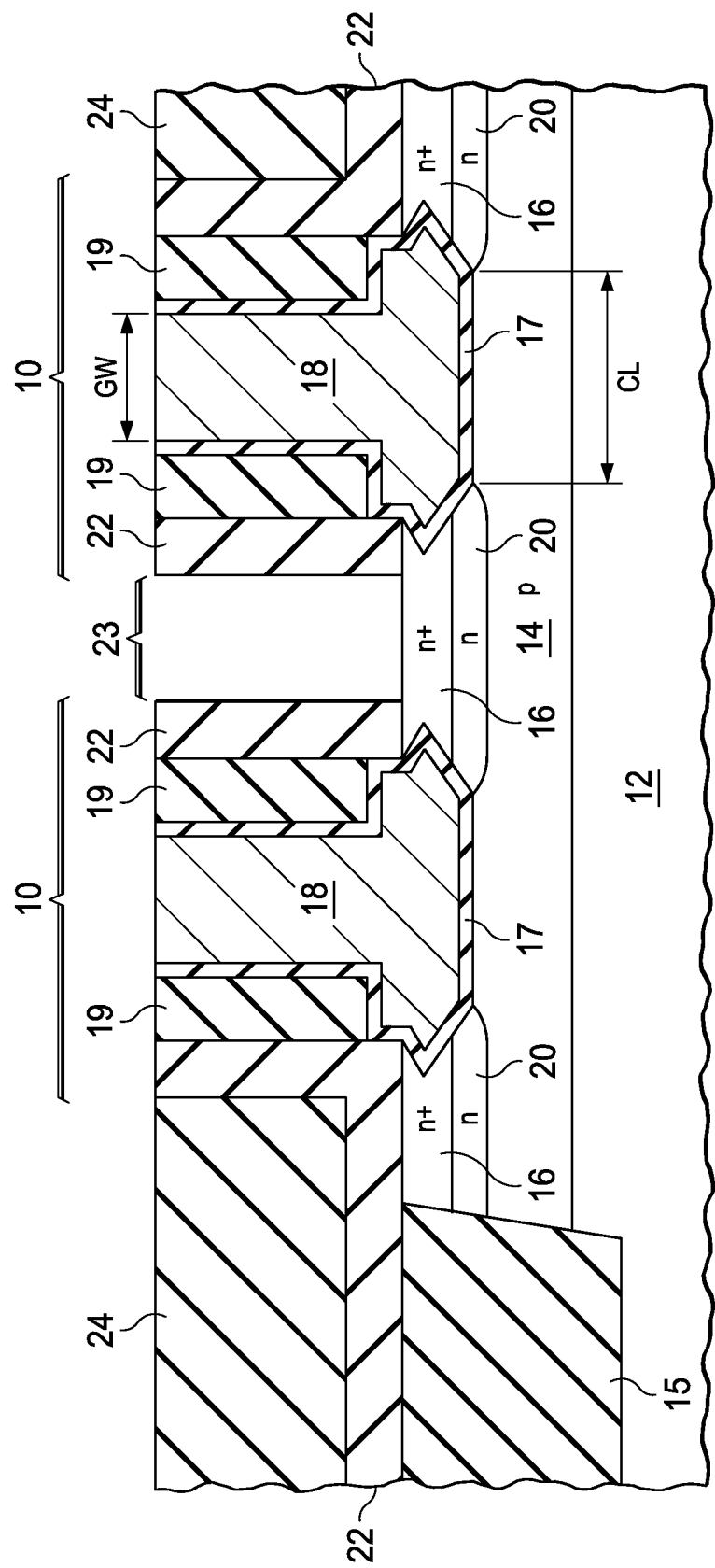
FIG. 1b is a cross-section view of the portion of the integrated circuit of FIG. 1a, including transistors constructed according to an embodiment of the invention.

FIGS. 1a and 1b illustrate, in plan and cross-sectional views, respectively, of two instances of transistor 10 constructed according to embodiments of this invention. In this example, each transistor 10 is an metal-oxide semiconductor (MOS) transistor formed at a selected location of the surface of single-crystal silicon substrate 12. More specifically, each transistor 10 is an n-channel MOS transistor formed at an active region of the surface of substrate 12. As known in the art, active regions are defined as those locations of the surface of substrate 12 located between isolation dielectric structures 15 (or surrounded by a single such structure 15, depending on the larger-scale layout of the integrated circuit). In this example, isolation dielectric structures 15 are formed as shallow trench isolation (STI) structures, which consist of an element of dielectric material formed by deposition or the like into a recess etched into the surface of substrate 12.

While this description pertains to similar transistors 10 disposed adjacent to one another in a single active region, it is of course to be understood that embodiments of this invention are directly applicable to single instances of transistor 10 (i.e., in its own instance of an active region) or more than two transistors 10 of the same or varying size in the same active region as one another.

As shown in FIG. 1b, transistors 10 are n-channel MOS transistors formed into p-type well 14, which in this example is a p-type doped region formed into selected locations of substrate 12 by way of conventional ion implantation and diffusion anneal. Alternatively, transistors 10 may be formed directly into p-type substrate 12 with no well region present. Further in the alternative, transistors 10 may be formed at the surface of a semiconductor layer disposed over an insulating layer, according to conventional silicon-on-insulator (SOI) technology, or in other similar substrate structures as known in the art. As will be evident to the skilled reader having reference to this specification, embodiments of this invention are applicable to both n-channel and p-channel MOS transistors.

Gate structures 18 of transistors 10 each overlie a portion of the active region and extend onto isolation dielectric structures 15 on either end, as shown in FIG. 1a. Gate structures 18 in this embodiment of the invention are formed of a metal or conductive metal compound, such as titanium, tungsten, tantalum, titanium nitride, tantalum nitride, tungsten nitride, or the like. In this example, gate structures 18 are separated from the surface of p-well 14 by gate dielectric 17. According to this embodiment of the invention, gate dielectric 17 consists of a thin layer of a "high-k" dielectric material such as hafnium oxide ($HfO_2$), hafnium zirconium oxide ($HfZrO_x$), and combinations of high-k materials, such as hafnium oxide in combination with zirconium oxide (e.g., $HfO_2/ZrO_2$ and $ZrO_2/HfO_2$). Other high-k dielectric materials known in the art may alternatively be used in embodiments of this invention.

It is contemplated that embodiments of this invention are particularly beneficial when constructed and used in connection with high-k, metal gate, transistors 10 as described in this specification, especially considering the benefits of this invention in connection with extremely narrow gate width structures. Alternatively, it is contemplated that embodiments of this invention may also be beneficial when used with other materials, such as polycrystalline silicon gate electrodes, and conventional gate dielectric films such as silicon dioxide and silicon nitride.

As shown in FIGS. 1a and 1b, dielectric spacers 19 are disposed along portions of the sidewalls of gate structures 18. The surface portion of substrate 12 (p-well 14 in this example) underlying spacers 19, perhaps extending for a distance under etch stop dielectric layer 22 disposed adjacent to and on the sides of spacers 19, contains an extension of gate structure 18, separated from the underlying silicon by gate dielectric 17. As will be described in further detail below, these portions of gate structure 18 and gate dielectric 17 are formed into a recess that is etched into the surface of substrate 12 at a location defined by and undercutting spacers 19 as shown.

Source/drain regions 16 are heavily doped n-type portions extending from the surface to a desired depth into p-well 14 at selected locations, in this embodiment of the invention. In this example, source/drain regions 16 are formed in a self-aligned manner relative to gate structure 18 and its spacers 19. As evident from FIG. 1b, transistors 10 are of the lightly-doped drain type, in that the drain extension regions 20 underlie respective source/drain regions 16; these drain extension regions 20 are more lightly-doped n-type doped regions extending to a depth below source/drain regions 16, and serve to reduce hot electron effects that are prevalent in small geometry devices such as transistors 10. The junction profiles of source/drain regions 16 and their drain extension regions 20 are defined by sidewall spacers 19. As is well-known in the art and as will be described below, drain extensions 20 are formed by a first ion implant process performed after definition of gate structure 18 and self-aligned therewith, followed by a second implant after formation of spacers 19 to form the heavier-doped source/drain regions 16.

As shown in FIG. 1b, etch stop dielectric layer 22 and interlevel dielectric 24 are disposed adjacent to gate structures 18 and spacers 19 over the active region, and also at locations overlying isolation dielectric structures 15. In this embodiment of the invention, etch stop dielectric layer 22 underlies interlevel dielectric 24, and are constructed of different materials from one another; for example, etch stop dielectric layer 22 may be formed of silicon nitride while interlevel dielectric 24 may be silicon dioxide.

As shown in FIGS. 1a and 1b, contact opening 23 is located at a selected location of central source/drain region 16. Contact opening 23 is formed by a masked etch of interlevel dielectric 24 at that location, followed by an etch of etch stop dielectric 22 at that same location, exposing the surface of source/drain region 16 at that location. A conductor (not shown) will subsequently be deposited into contact opening 23, to provide electrical connection between that instance of source/drain region 16 and elsewhere in the integrated circuit. Contacts and conductive connections will similarly be made to other instances of source/drain regions 16, and to gate structures 18 at the desired locations, but are not shown in FIGS. 1a and 1b for the sake of clarity.

For purposes of this definition, the term "gate width" will refer to the typically narrower dimension of a gate electrode in a direction generally parallel to the direction of conduction between source and drain of the transistor. In conventional planar MOS transistors, for example, this gate width essentially defines the "channel length", which is the length of the inversion channel between source and drain for the transistor in its linear region (before pinch-off). Conversely, the terms "gate length" and "channel width" will refer to the size of the gate electrode (and thus the conduction channel) perpendicular to the direction of source/drain conduction. To further elaborate these definitions for purposes of this description, the transconductance of a conventional MOS transistor would thus be proportional to the ratio of channel width to channel length (W/L), and analogously to the ratio of gate length to gate width.

According to embodiments of this invention, gate structures 18 of transistors 10 have a gate width GW that is defined by the photolithographic patterning and etch technology of the manufacturing process, and which is typically the minimum feature size of that technology. This gate width GW essentially corresponds to the width of the upper portion of gate structures 18 as shown in FIGS. 1a and 1b, and is defined by the minimum feature size for patterning and etching a polysilicon "dummy" gate electrode according to embodiments of this invention.

Referring to FIG. 1b, the inversion channel of transistor 10 will extend from the p-n junction between drain extension 20 and p-well 14 on one side of a gate structure 18, to the p-n junction between p-well 14 and drain extension 20 on the other side of that same gate structure 18. The recessed construction of transistors 10 according to embodiments of this invention results in an effective electrical channel length CL that is substantially longer than the patterned gate width GW, as shown in FIGS. 1a and 1b. It is contemplated that channel length CL may be as much as 50% longer than the patterned gate width GW, in implementations of embodiments of this invention. For example, it is contemplated that embodiments of this invention enable the formation of transistors 10 with gate widths GW of about 20 nm and with channel lengths CL ranging from about 22 nm to as much as 30 nm. This lengthened effective channel length CL relative to gate width GW is contemplated to substantially reduce the short-channel effects affecting transistors 10 according to embodiments of this invention, relative to conventional transistors that suffer from ballistic transport behavior, drain-induced barrier lowering, and other short-channel effects. This benefit is attained, according to embodiments of this invention, while still enabling gate structures 18 to have extremely small gate widths, deep in the sub-micron range, reducing the chip area required for realization of the overall integrated circuit function.

In addition, it is contemplated that transistors 10 constructed according to embodiments of the invention will attain excellent performance in combination with its longer effective channel length, with relatively better performance than conventional recessed channel transistors. For example, transistors constructed in the manner described in U.S. Pat. No. 7,804,130 and discussed above result in a V-shaped channel region, with its surfaces following the <111> silicon crystal orientation plane. In contrast, as will be described in further detail below, transistors 10 have longer channel lengths along a <100> surface at the bottom of the recess, while the undercut etch is self-limiting at the <111> planes. As known in the art, the <100> surface is a smoother surface, exhibiting higher carrier mobility and thus improved performance.

Referring now to FIGS. 2a through 2k, a method of fabricating transistors 10 in an integrated circuit, according to an embodiment of the invention, will now be described with reference to cross-sectional views of the structure at various stages of the manufacturing process. This description begins with the integrated circuit structure in the form shown in FIG. 2a, in which the structure includes features common to conventional polysilicon-gate MOS integrated circuits. In this example, p-well 14 is formed at the surface of single-crystal silicon substrate 12 by a conventional ion implantation process. If transistors 10 are being formed in a complementary-MOS (CMOS) integrated circuit, n-type wells may be formed at other locations of substrate 12 as desired. Alternatively, transistors 10 may be formed at the surface of substrate 12 without necessitating a well implant, if substrate 12 has the appropriate channel conductivity type and dopant concentration. Further in the alternative, it is contemplated that this invention may be implemented in other types of semiconductor bodies, for example in a single-crystal semiconductor layer overlying an insulator layer according to the well-known silicon-on-insulator (SOI) technology. These and other implementation environments are contemplated to be within the scope of the claims in this case.

Isolation dielectric structure 15 extends into substrate 12 from its surface, and may serve as a boundary of p-well 14. In this example, isolation dielectric structure 15 is composed of silicon dioxide, deposited into an etched trench according to the well-known shallow trench isolation (STI) technology. Other instances of isolation dielectric structure 15 will be present at those locations at which electrical isolation of surface elements is desired. Active regions of the surface of substrate 12 are defined at those locations at which isolation dielectric structures 15 are not present.

Figure 2A:
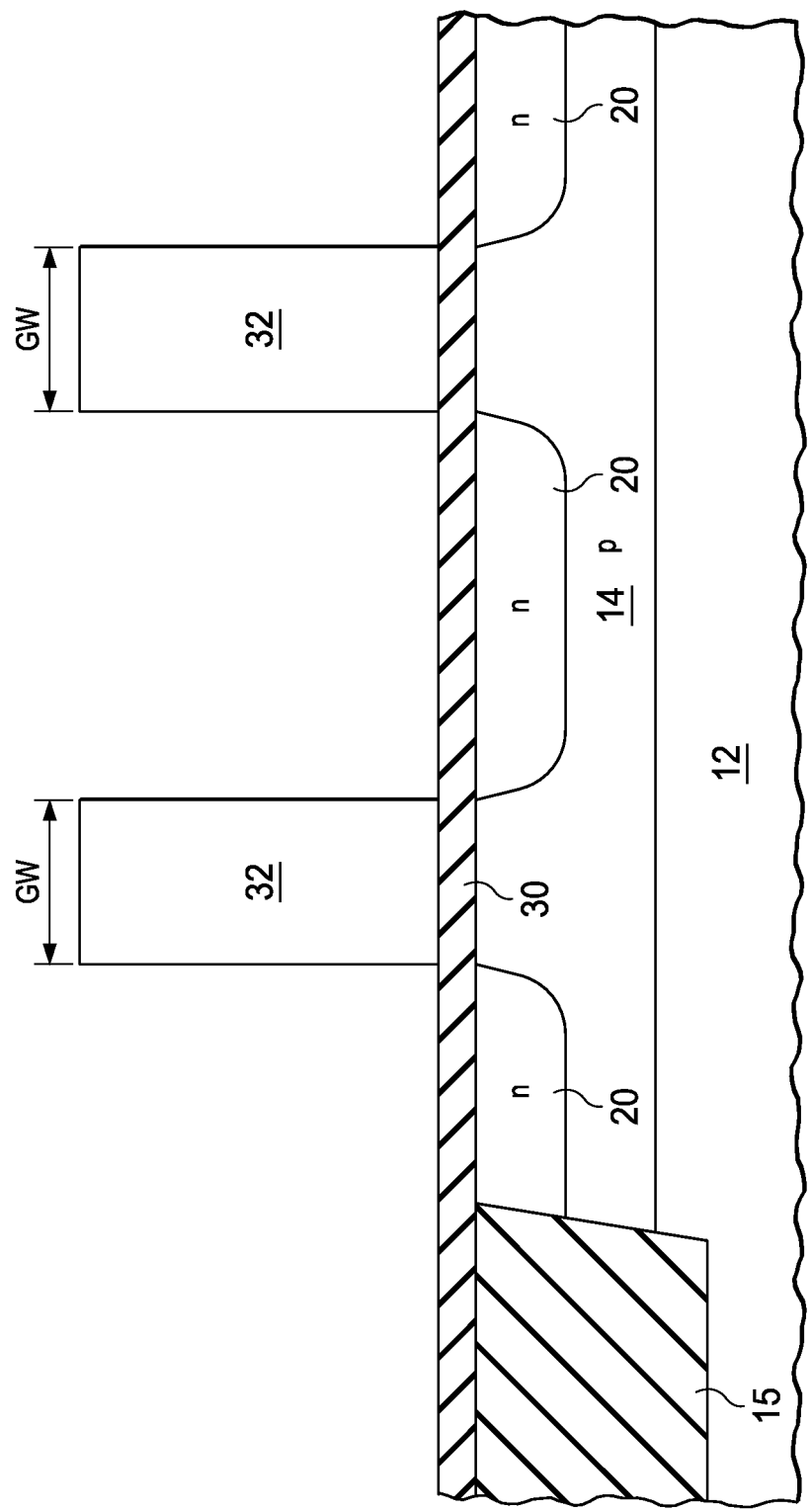

At the point in the manufacture shown in FIG. 2a, "dummy" gate dielectric layer 30 is disposed overall, including over the active region at the surface of p-well 14, and isolation dielectric structures 15. Dummy gate dielectric 30 is referred to as a "dummy" layer, because it will eventually be removed in favor of the eventual gate dielectric of transistors 10. Dummy gate dielectric 30 may be silicon dioxide or silicon nitride, or a combination of the two, or may consist of some other material suitable to its placeholder function. Dummy polysilicon gate structures 32 overlie dummy gate dielectric 30 at the locations at which the eventual metal transistor gate structures 18 will be formed; as such, these dummy polysilicon gate structures 32 are eventually removed, as will be described below. Dummy polysilicon gate structures 32 are formed in the conventional manner by depositing polycrystalline silicon material overall, followed by photolithographic patterning of a mask material and an anisotropic etch. As mentioned above, this patterned etch is contemplated to typically be performed to the minimum feature size for the manufacturing technology being used; in any event, dummy gate polysilicon structures 32 are patterned and etched to gate width GW, as shown in FIG. 2a. According to embodiments of this invention, the etch of dummy polysilicon gate structures 32 does not remove dummy gate dielectric layer 30 from those locations from which polysilicon is etched, as shown in FIG. 2a.

According to embodiments of this invention, drain extensions 20 are implanted at this stage of the process, so as to be formed in a self-aligned manner relative to dummy polysilicon gate structures 32. This process implants n-type ions of the desired dose and energy so as to define drain extensions 20 of the eventual desired depth and dopant concentration. An anneal may be performed at this stage of the process to form drain extensions 20 at or near the desired eventual depth, as shown in FIG. 2a; alternatively, subsequent anneal or high temperature processes can serve to diffuse the implanted dopant to the desired profile, as known in the art.

Figure 2B:
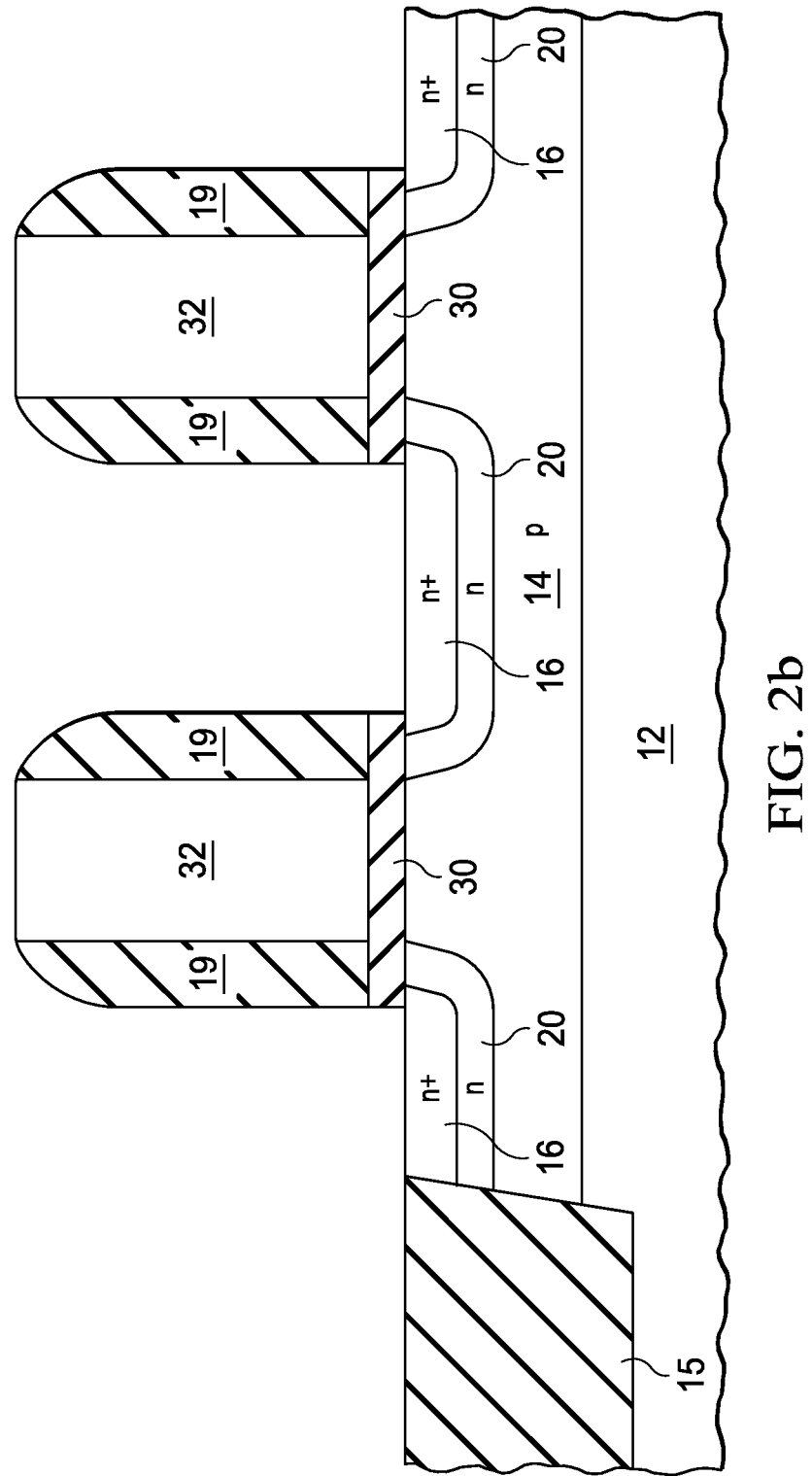

Sidewall spacers 19 are then formed on the sides of dummy gate structures 32, as shown in FIG. 2b. Dielectric spacers 19 may be formed of any suitable dielectric material, such as silicon dioxide or silicon nitride, and in the conventional manner by way of chemical vapor deposition followed by anisotropic etch. Either as part of the anisotropic etch of the material of spacers 19, or by way of a separate and subsequent etch, dummy gate dielectric layer 30 is then removed from the surface at those locations not underlying dummy gate structures 32 and spacers 19. To facilitate the removal of dummy gate dielectric layer 30, it may be preferred to select different material for dielectric spacers 19 from that of dummy gate dielectric layer 30 (e.g., silicon nitride vs. silicon dioxide). As will become evident below, the width of spacers 19 will serve to define the size and shape of the channel recess subsequently etched into the surface of substrate 12.

In addition, as shown in FIG. 2b, spacers 19 also define the placement of heavily-doped source/drain regions 16, which are formed by an ion implant performed after the anisotropic etch that forms spacers 19. This source/drain implant process implants n-type ions of the desired dose and energy so as to define source/drain regions 16 of the eventual desired depth and dopant concentration, in a self-aligned manner relative to dummy gate structures 32 and spacers 19. As typical in the art, source/drain regions 16 will be more heavily doped n-type (for n-channel transistors 10 in this example) than drain extensions 20. However, according to embodiments of this invention, the energy of the source/drain implant and the eventual drive-in anneal conditions are selected so that source/drain regions 16 are formed to a shallower depth than drain extensions 20, such that drain extensions 20 will effectively surround source/drain regions 16 as shown in FIG. 2b. The drive-in diffusion anneal may be performed at this stage of the process to form source/drain regions 16 (and drain extensions 20, if desired) to the desired eventual depth, or such an anneal may be performed later in the process, considering other high-temperature processing.

Figure 2C:
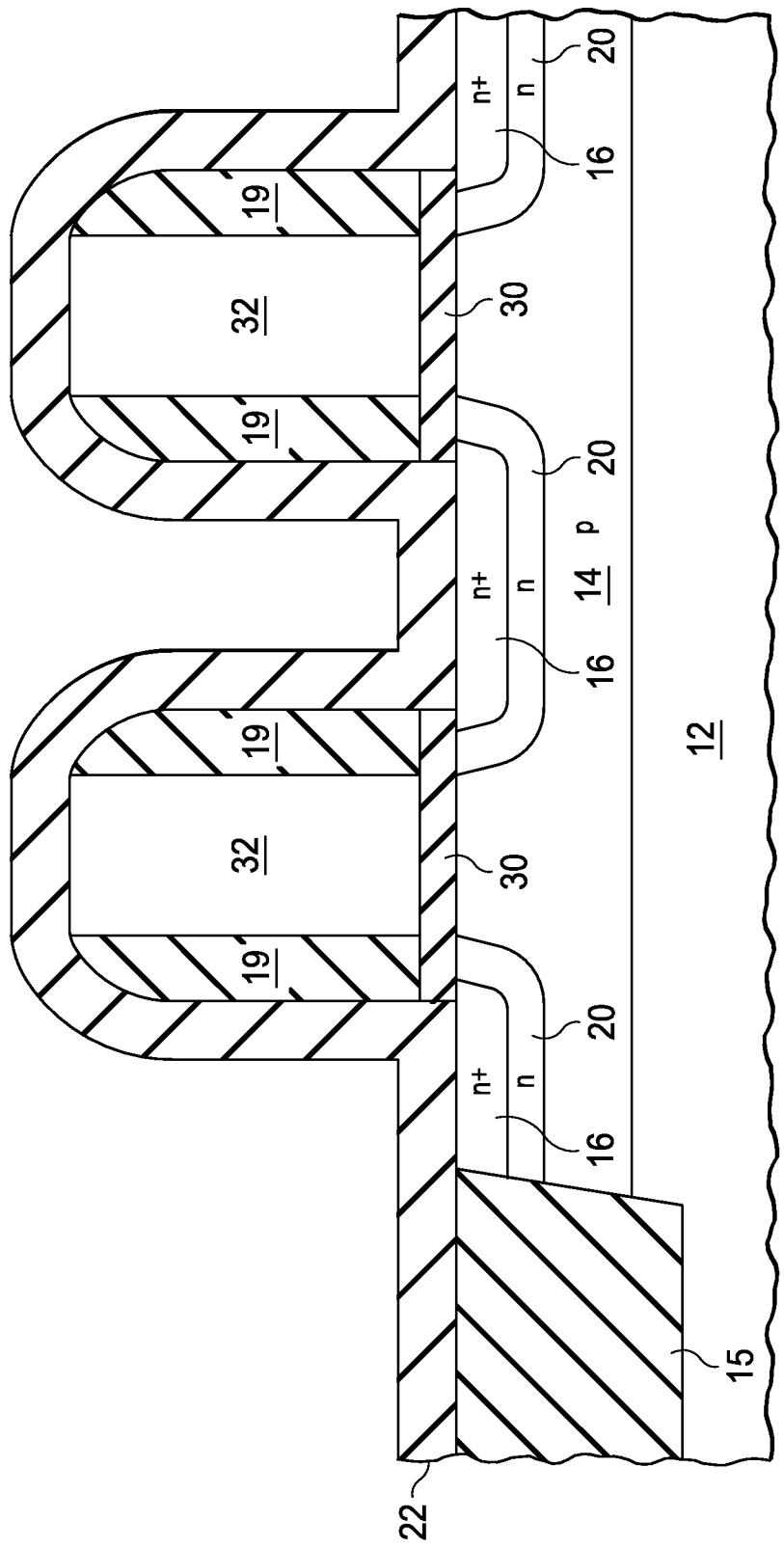

Following the source/drain implant, etch stop dielectric layer 22 is then deposited overall, resulting in the structure shown in FIG. 2c. Etch stop dielectric layer 22 is a conventional dielectric material, for example silicon nitride, that differs from the composition of overlying materials so as to be resistant to an etch of that overlying material. Such an etch stop provides process margin to that overlying etch, while protecting the underlying structures (e.g., the surface of source/drain regions 16), as known in the art, particularly if the etch of that material will be stopping at different physical levels. The thickness and composition of etch stop dielectric layer 22 will therefore depend on the particular materials and etch involved. It is contemplated that those skilled in the art will be readily able to select the appropriate characteristics of etch stop dielectric layer 22 accordingly, without undue experimentation.

Figure 2D:
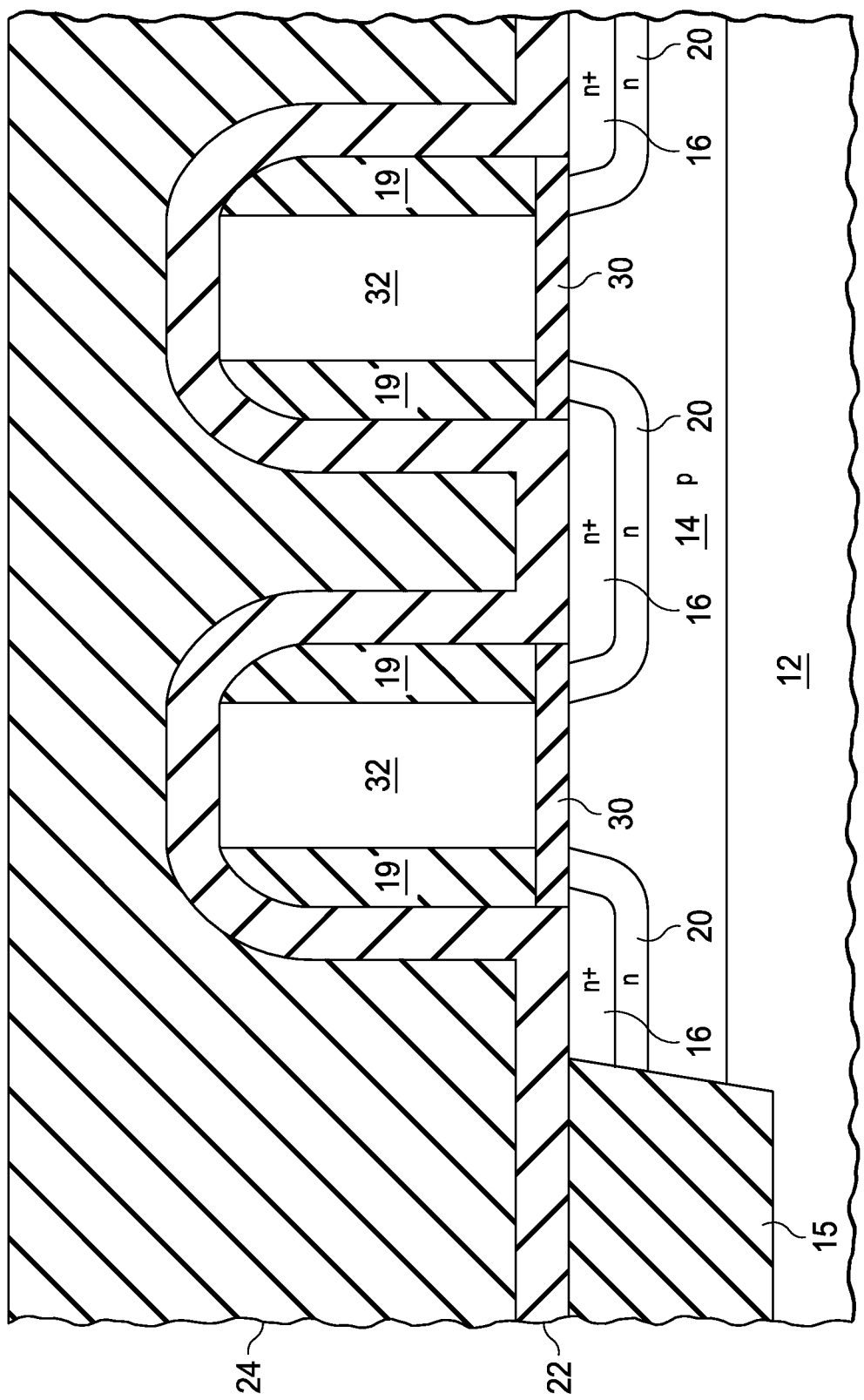

In this embodiment of the invention, interlevel dielectric layer 24 is then deposited overall, covering etch stop dielectric layer 22 as shown in FIG. 2d. According to this embodiment of the invention, interlevel dielectric layer 24 as deposited will be relatively thick, extending well above the thickness of dummy gate structures 32 as covered by etch stop dielectric layer 22. As mentioned above, the composition of interlevel dielectric layer 24 will differ from that of etch stop dielectric layer 22 to facilitate its etch. For example, if etch stop dielectric layer 22 is silicon nitride, interlevel dielectric layer 24 may be formed of silicon dioxide.

Figure 2E:
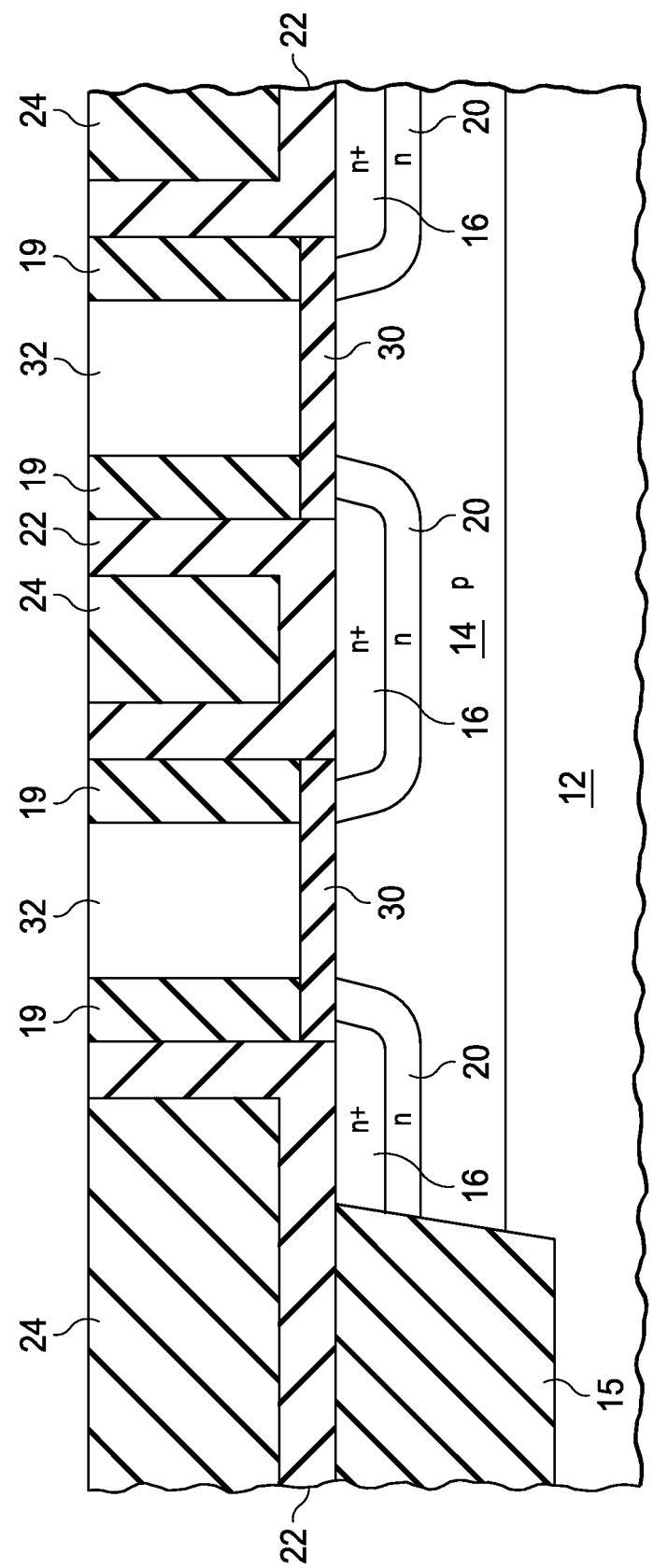

According to embodiments of this invention, the structure is then planarized by way of chemical-mechanical polishing (CMP), to a depth that exposes the top surface of dummy polysilicon gate structures 32, as shown in FIG. 2e, while still ensuring adequate interlevel dielectric layer 24 thickness to properly insulate underlying structures. Dummy polysilicon gate structures 32 are then removed by way of an appropriate etch, resulting in the structure of FIG. 2f. This polysilicon etch may be a blanket etch, using either a "wet" etch or a plasma etch, or alternatively may be a masked etch so that certain ones of polysilicon gate structures 28 may remain to serve as eventual transistor gate electrodes, or other structures such as resistors or capacitor plates, elsewhere in the integrated circuit.

Figure 2F:
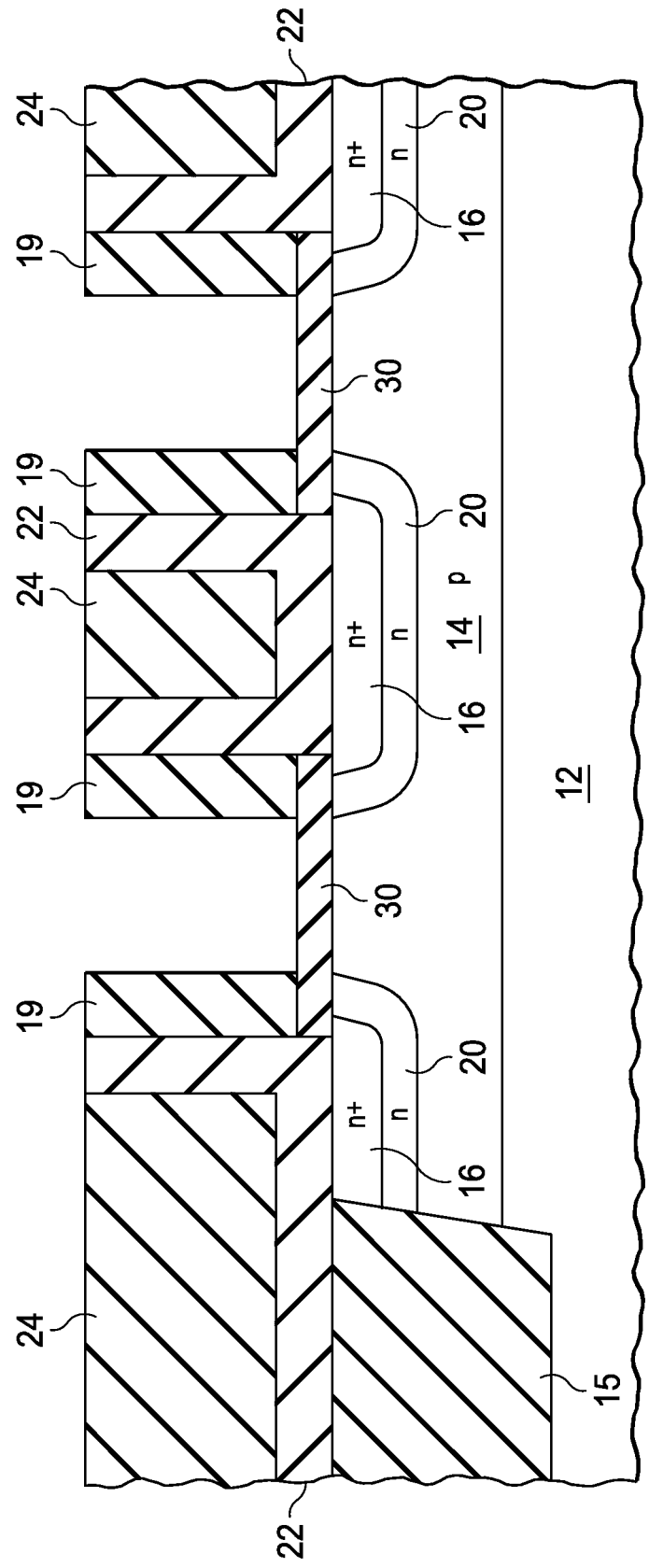

As shown in FIG. 2f, portions of dummy gate dielectric 30 are exposed by the removal of dummy polysilicon gate structures 32. According to embodiments of the invention, dummy gate dielectric 30 is then removed at these exposed locations by an etch that exhibits isotropy to such an extent so that portions of dummy gate electric 30 underlying spacers 19 are removed, exposing the surface of substrate 12 at those locations underlying spacers 19. This etch of dummy gate dielectric 30 may be a "wet" etch of the appropriate species (i.e., exposing the surface to a liquid solution of the desired etchant, as known in the art) or may alternatively be a plasma etch using the appropriate etchant and under such conditions that remove those portions of dummy gate dielectric 30 under spacers 19. FIG. 2g illustrates the structure following this removal of dummy gate dielectric 30.

Figure 2H:
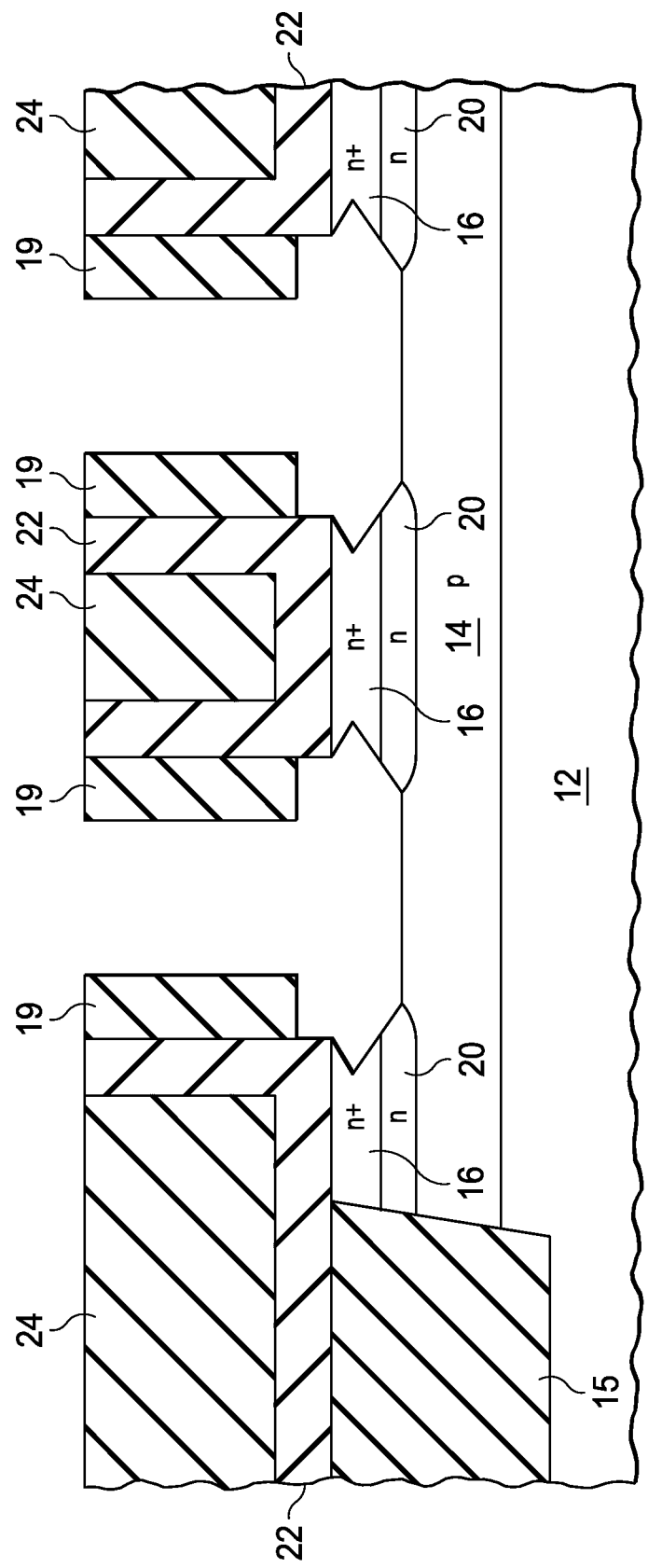

As part of the same etch as used to remove dummy gate dielectric 30, or by way of a subsequent separate etch, etching of a recess into the surface of substrate 12 is then performed according to embodiments of this invention. This silicon etch is performed in a manner that exhibits isotropy to such an extent as to form a recess that extends to some distance under the dielectric material adjacent to spacers 19 (e.g., etch stop dielectric 22), as shown in FIG. 2h. Examples of an etch suitable for this silicon etch include a wet etch using a liquid solution of a silicon etchant such as potassium hydroxide, ammonium hydroxide, or tetramethylammonium hydroxide, and a plasma etch using an activated species of a silicon etchant such as potassium hydroxide, ammonium hydroxide, or tetramethylammonium hydroxide.

Figure 3:
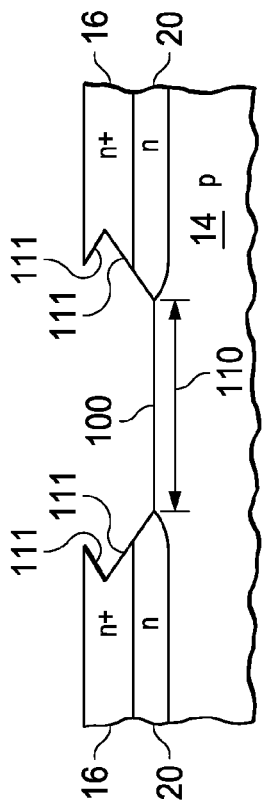
FIG. 3 is a cross-sectional view illustrating the silicon crystal orientation at surfaces of a recess formed in the method of FIGS. 2a through 2k according to that embodiment of the invention.

It is preferred that this silicon etch, whether a wet etch or a plasma etch, is self-limiting in the <111> silicon crystal planes, while preferentially etching the <100> silicon plane. Referring to FIG. 3, applying such an etch to substrate 12 that has a <100> surface at which transistors 10 are being formed results in a bottom surface of the recess that is in the <100> plane, with side surfaces that are in the <111> plane as shown. This orientation is contemplated to be especially beneficial, considering that the <100> crystal surface is relatively smooth as compared with the <111> surface, providing higher carrier mobility than in the <111> plane. Because the inversion channel of transistors 10 extends between the metallurgical junctions between p-well 14 and n-type drain extension 20 on opposing sides of the recess, embodiments of this invention thus result in a recessed channel with a channel length CL (FIG. 1b) that is substantially longer than the patterned gate width GW, and that is along the high-mobility <100> silicon surface for much, if not all, of channel length CL. This orientation therefore provides transistors 10 with an increased channel length CL so as to reduce short-channel effects, while still providing excellent electrical performance due to its channel at the optimum <100> silicon crystal surface (i.e., source/drain conduction is in the optimum <110> direction, as shown).

Figure 2I:
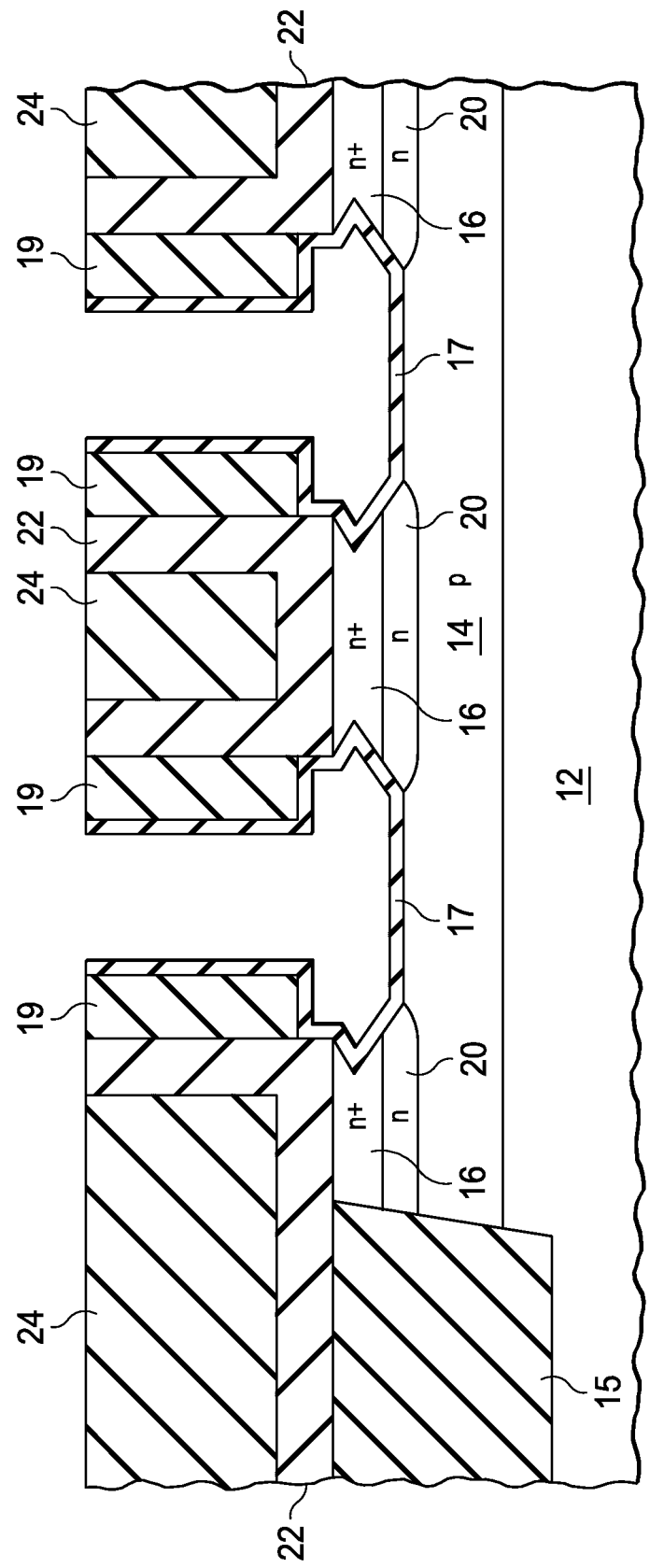

Referring to FIG. 2i, gate dielectric 17 is then formed in the recess and also along the sides of spacers 19 and other dielectric structures (e.g., etch stop dielectric 22). In embodiments of this invention, gate dielectric 17 is formed by way of atomic layer deposition (ALD) to ensure proper dielectric integrity, considering the complex geometry of the recess into substrate 12 presented by embodiments of this invention. The material of gate dielectric 17 is selected according to the desired electrical properties and construction of transistors 10. For the example of a high-k metal gate technology, gate dielectric 17 will be formed of a high-k material such as hafnium oxide ($HfO_2$); hafnium zirconium oxide ($HfZrO_x$); combinations of high-k materials, such as hafnium oxide in combination with zirconium oxide (e.g., $HfO_2/ZrO_2$ and $ZrO_2/HfO_2$); and other high-k dielectric materials known in the art.

Figure 2J:
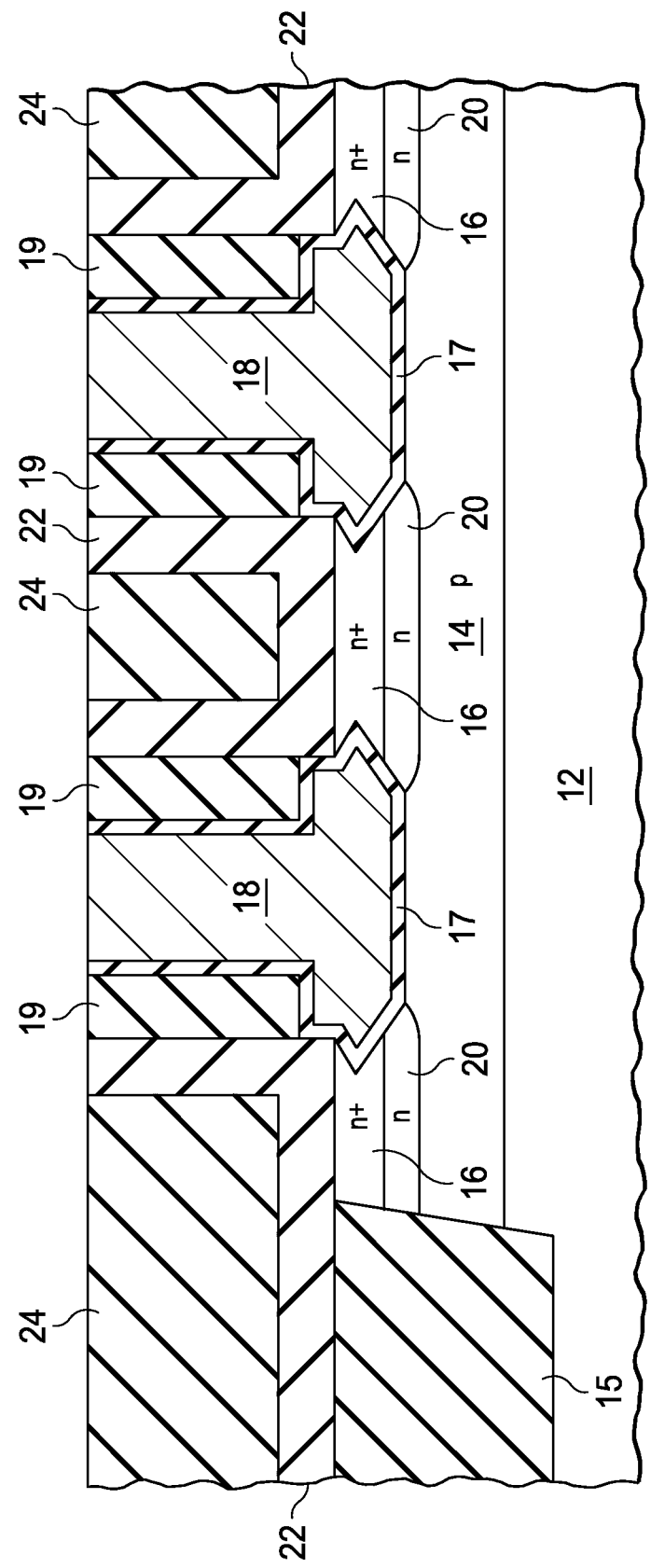

The material of gate structure 18 can then be deposited, filling the interior of the void between spacers 19 and the recess into substrate 12, with gate dielectric 17 already in place. The particular mechanism of this deposition may depend on the species of the material, the shape and size of the void being filled, and the like; examples of appropriate deposition techniques include ALD, reactive sputtering, chemical vapor deposition, etc. For the example of a high-k metal gate technology, the composition of gate structures 18 may include metals such as titanium, tungsten, tantalum, titanium nitride, tantalum nitride, tungsten nitride, or the like, and combinations thereof, including barrier layers as necessary. Following deposition, planarization of the structure may again be performed. It is contemplated that those skilled in the art having reference to this specification will be readily able to deposit the material of gate structures 18 so as to form gate structures 18 as shown in FIG. 2j.

Figure 2K:
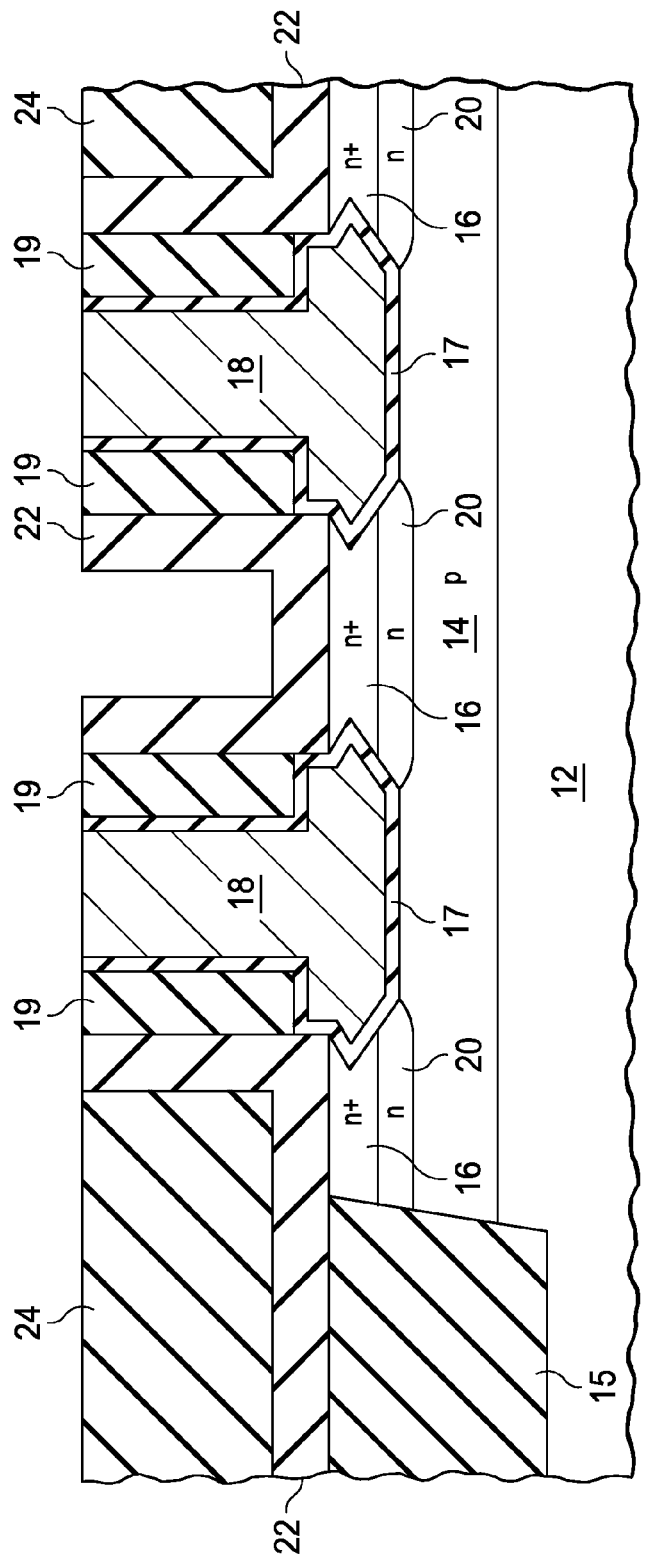

Contact to the terminals of transistors 10 may then be made in the conventional manner. In this embodiment of the invention, with the combination of etch stop dielectric 22 and interlevel dielectric 24, a suitable approach includes a masked etch of interlevel dielectric 24 to remove that material from the desired contact locations 23 (FIG. 1b), with the etch stopping on etch stop dielectric layer 22. The result of such a structure is shown in FIG. 2k. A separate etch of etch stop dielectric layer 22 itself, in order to expose the desired contact locations (e.g., source/drain region 16) can then be performed, using the same patterned mask as used to define the etch of interlevel dielectric 24 if desired. The resulting structure at this point in the process is shown in FIGS. 1a and 1b, discussed above.

The integrated circuit is then completed in the conventional manner, including the deposition and patterning of the appropriate overlying metal conductors, formation of additional interlevel dielectric layers, and etching of contact locations through those layers, such processes repeated according to the number of conductor levels to be formed in the integrated circuit.

As described above, embodiments of this invention result in a transistor structure that have an effective channel length longer than that defined by the width of the gate electrode, and methods of fabricating such transistor structures. The resulting transistors are thus less vulnerable to short-channel effects than are conventional planer transistors with gate electrodes of the same patterned gate width. Accordingly, embodiments of this invention are particularly well-suited for implementation with modern fabrication technologies capable of attaining gate widths deep in the sub-micron regime, for example as small as 20 nm or less, and as such is suitable for extremely high levels of integration and device density per unit chip area. Furthermore, embodiments of this invention enable the formation of such transistors using recessed channels in which most if not all of the conduction channel is along a preferential crystal orientation, for purposes of electrical performance. Accordingly, potential degradation in electrical performance resulting from the increased channel length and accompanying reduced short-channel effects is ameliorated. Embodiments of this invention are also readily compatible with modern high-k metal gate transistor construction.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating a metal-oxide-semiconductor field-effect transistor formed at a surface of single-crystal silicon, the surface having a first conductivity type, the method comprising:
   forming dummy gate dielectric at a selected location of the surface, the selected location of the surface having a first conductivity type;
   forming a dummy gate electrode overlying the dummy gate dielectric at the selected location;
   forming dielectric structures on opposing sides of the dummy gate electrode, portions of the dielectric structures overlying portions of the dummy gate dielectric;

forming source/drain regions of a second conductivity type into the surface at locations on opposite sides of the dummy gate electrode;

then removing the first dummy gate electrode;

etching the dummy gate dielectric material from the selected location of the surface and under portions of the dielectric structures;

etching a recess into the silicon at locations between and under the dielectric structures;

forming a gate dielectric layer at the surface of the recess; and forming a gate electrode overlying the gate dielectric layer and between the dielectric structures, the gate electrode having portions extending under the dielectric structures.

2. The method of claim 1, wherein the step of forming the dielectric structures comprises:

after the step of forming the dummy gate electrode, forming sidewall dielectric spacers on opposing sidewalls of the dummy gate electrode; and after the step of forming source/drain regions, depositing dielectric material over the source/drain regions.

3. The method of claim 2, wherein the step of forming source/drain regions comprises:

prior to the step of forming sidewall dielectric spacers, implanting the surface with dopant ions of the second conductivity type to form a region of the second conductivity type extending from the surface to a first depth.

4. The method of claim 3, wherein the step of forming source/drain regions further comprises:

after to the step of forming sidewall dielectric spacers, implanting the surface with dopant ions of the second conductivity type to form a region of the second conductivity type extending from the surface to a second depth shallower than the first depth.

5. The method of claim 2, wherein the step of depositing dielectric material over the source/drain regions comprises:

depositing an etch stop dielectric layer overall;

then depositing an interlevel dielectric layer overall;

then performing chemical-mechanical polishing to remove the etch stop dielectric and interlevel dielectric layers so as to expose a top surface of the dummy gate electrode.

6. The method of claim 1, wherein the step of etching a recess comprises:

exposing the surface to a silicon etchant.

7. The method of claim 6, wherein the exposing step exposes the surface to a liquid solution of the silicon etchant.

8. The method of claim 6, wherein the exposing step exposes the surface to a plasma of a silicon etchant species.

9. The method of claim 6, wherein the silicon etchant is selected from the group consisting of potassium hydroxide, ammonium hydroxide, and tetramethylammonium hydroxide.

10. The method of claim 6, wherein the single-crystal silicon is arranged so that the exposing step preferentially etches silicon surfaces in the <100> plane relative to surfaces in the <111> plane.

11. The method of claim 1, wherein the step of forming a gate dielectric layer at the surface of the recess comprises:

depositing a layer of a high-k dielectric material.

12. The method of claim 11, wherein the step of forming a gate electrode comprises:

depositing a layer of a conductive material comprising a metal.

13. A method of fabricating a metal-oxide-semiconductor field-effect transistor formed at a surface of single-crystal silicon, the surface having a first conductivity type, the method comprising:

forming dummy gate dielectric at a selected location of the surface, the selected location of the surface having a first conductivity type;

forming a dummy gate electrode overlying the dummy gate dielectric at the selected location;

forming dielectric structures on opposing sides of the dummy gate electrode, portions of the dielectric structures overlying portions of the dummy gate dielectric;

forming source/drain regions of a second conductivity type into the surface at locations on opposite sides of the dummy gate electrode;

then removing the first dummy gate electrode;

etching the dummy gate dielectric material from the selected location of the surface and under portions of the dielectric structures, leaving a space between the dielectric structures and the silicon;

etching a recess into the silicon at locations between and under the dielectric structures;

forming a gate dielectric layer extending along a side surface of the dielectric structures, along a bottom surface of the dielectric structures in the space, and along a surface of the recess; and forming a gate electrode adjacent the gate dielectric layer including in the space and between the dielectric structures.

* * * * *